United States Patent
John et al.

(10) Patent No.: US 7,442,616 B2
(45) Date of Patent: Oct. 28, 2008

(54) METHOD OF MANUFACTURING A BIPOLAR TRANSISTOR AND BIPOLAR TRANSISTOR THEREOF

(75) Inventors: Jay P. John, Chandler, AZ (US); James A. Kirchgessner, Tempe, AZ (US); Matthew W. Menner, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 251 days.

(21) Appl. No.: 11/454,654

(22) Filed: Jun. 15, 2006

(65) Prior Publication Data

US 2007/0290231 A1    Dec. 20, 2007

(51) Int. Cl.
*H01L 21/8222* (2006.01)
*H01L 29/70* (2006.01)

(52) U.S. Cl. .............. 438/309; 438/350; 438/369; 257/565; 257/E21.35; 257/E21.372; 257/E29.044; 257/E29.124

(58) Field of Classification Search ........... 438/309, 438/311, 312, 313, 317, 320, 321, 322, 349, 438/350, 364, 365, 367, 369; 257/197, 198, 257/565, E21.35, E21.372, E29.044, E29.124
See application file for complete search history.

(56) References Cited

U.S. PATENT DOCUMENTS

| 5,139,959 | A | * | 8/1992 | Craft et al. ............... 438/328 |
| 5,296,391 | A | | 3/1994 | Sato et al. |
| 5,326,710 | A | * | 7/1994 | Joyce et al. ............ 438/203 |
| 5,432,104 | A | | 7/1995 | Sato |
| 5,759,883 | A | | 6/1998 | Kinoshita |
| 6,482,710 | B2 | | 11/2002 | Oda et al. |
| 6,492,238 | B1 | | 12/2002 | Ahlgren et al. |
| 6,635,545 | B2 | | 10/2003 | Bock et al. |
| 2001/0010382 | A1 | * | 8/2001 | Gregory .................. 257/373 |
| 2004/0195655 | A1 | * | 10/2004 | Ohnishi et al. ........... 257/575 |
| 2005/0236647 | A1 | * | 10/2005 | Khater ..................... 257/197 |

FOREIGN PATENT DOCUMENTS

WO    WO02/47160 A2    6/2002
WO    WO03/049191 A2   6/2003

* cited by examiner

*Primary Examiner*—Thanh V Pham
(74) *Attorney, Agent, or Firm*—Bryan Cave LLP

(57) ABSTRACT

A bipolar transistor (100) is manufactured using the following processes: (a) forming a base electrode layer (129) as a portion of a base electrode over a semiconductor substrate (110); (b) forming a first portion of an emitter electrode (154) over the base electrode layer; (c) forming a mask layer (280) over a first portion of the base electrode layer, a portion of the first portion of the emitter electrode and a portion of the semiconductor substrate; and (d) implanting a dopant into a second portion of the base electrode layer after forming the emitter electrode after forming the mask layer.

20 Claims, 4 Drawing Sheets

METHOD OF MANUFACTURING A BIPOLAR TRANSISTOR AND BIPOLAR TRANSISTOR THEREOF

FIELD OF THE INVENTION

This invention relates generally to bipolar transistors, and relates more particularly to a method of forming a bipolar transistor.

BACKGROUND OF THE INVENTION

Recently, the Federal Communication Commission approved use of the 77 gigahertz (GHz) radio band for the automobile radar market. To operate at this ultra high frequency band, a transistor must have a peak transit frequency, $f_T$, of approximately 200 GHz and a maximum oscillation frequency, $f_{MAX}$, of greater than 200 GHz.

Currently, the majority of silicon-based products operating in the high frequency bands use SiGe BiCMOS (silicon germanium bipolar complimentary metal oxide semiconductor) technologies. For many of these products, a peak $f_{MAX}$ of 100 GHz is sufficient. In contrast, products operating at 77 GHz or another ultra high frequency band will most likely require use of a BiCMOS (bipolar complimentary metal oxide semiconductor) technology that includes a much higher performance SiGe HBT (silicon germanium heterojunction bipolar transistor) device.

Furthermore, conventional doping of the base electrode layer in a selective epitaxial base bipolar transistor occurs early in the HBT (heterojunction bipolar transistor) manufacturing process, usually during the deposition of the emitter/base stack. Following the doping, the base electrode layer is exposed to numerous low and medium temperature processes, that can induce dopant loss, cause segregation of the dopant in the oxide layers, and deactivate the dopant.

Accordingly, a need exists for a manufacturing process for a HBT that can be used at the 77 GHz radio band and increase dopant in the base electrode layer.

BRIEF DESCRIPTION OF THE DRAWINGS

The invention will be better understood from a reading of the following detailed description, taken in conjunction with the accompanying figures in the drawings in which.

Figure 1:
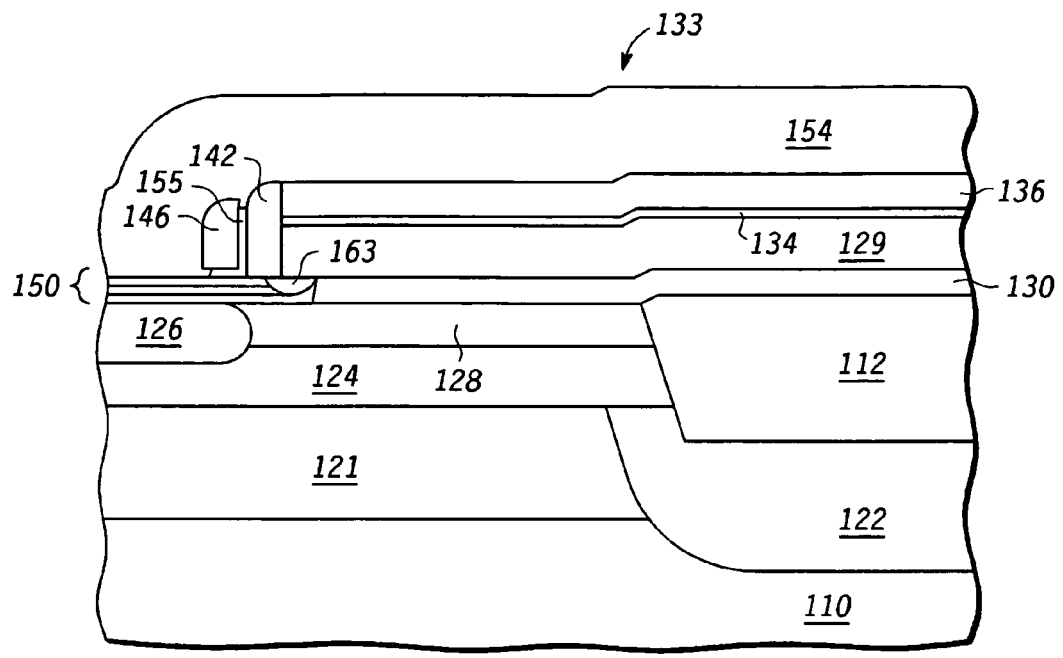
FIG. 1 illustrates a cross-sectional view of a portion of a bipolar transistor after a first stage of a manufacturing process according to a first embodiment.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly coupled in an electrical or non-electrical manner.

DETAILED DESCRIPTION OF THE INVENTION

A bipolar transistor is manufactured using the following processes: (a) forming a base electrode layer over a semiconductor substrate; (b) forming a first portion of an emitter electrode over the base electrode layer; (c) forming a mask layer over a first portion of the base electrode layer, a second portion of the first portion of the emitter electrode and a first portion of the semiconductor substrate; and (c) implanting a dopant into a second portion of the base electrode layer after forming the emitter electrode and after forming the mask layer.

In another embodiment, the bipolar transistor is manufactured by the following process: (a) forming a base electrode layer over a semiconductor substrate; (b) forming one or more dielectric layers over the base electrode layer; (c) forming an electrically conductive layer over a first portion of the base electrode layer; (d) forming an etch mask layer over the electrically conductive layer; (e) using the etch mask layer to pattern the electrically conductive layer to form a first portion of an emitter electrode; (f) using the etch mask layer to pattern the one or more dielectric layers; and (g) self-aligning an implant of a dopant into a second portion of the base electrode layer using the etch mask layer as an implant mask for the dopant.

Referring now to the figures, FIG. 1 illustrates a cross-sectional view of a portion of a bipolar transistor 100 after a first stage of a manufacturing process according to a first embodiment.

As an example, the portion of the bipolar transistor 100 can include a p-type bulk silicon wafer or a n-type bulk silicon wafer. In one embodiment, substrate 110 is a p-type substrate and includes a heavily doped n-type region 122, a heavily doped n-type region 121, a less-heavily doped n-type region 124, and a moderately-doped n-type region 128. An isolation structure 112 comprised of a non-electrically conductive material is formed over a portion of region 122 and adjacent to regions 124 and 128. A dielectric layer 130 is formed over a portion of region 128 and structure 112. A portion of regions 124 and 128 can be optionally doped more heavily to form region 126. Regions 121, 122, 124, 126 form the collector of the a portion of the bipolar transistor 100. The intrinsic base of the a portion of the bipolar transistor 100 is contained in the epitaxial layer 150, which is formed over a portion of region 128 and 126. As an example, layer 150 can include a three layer heterojunction epitaxial structure containing the intrinsic base, and in which will be formed the emitter-base and collector-base junction regions of an HBT.

Dielectric spacers 142, 146, and 155 can be formed sequentially over layer 150 and within an emitter region 133, which has been formed in a base electrode stack. The base electrode stack includes a base electrode layer 129 and two dielectric layers 134 and 136. As an example, layer 129 can be a p-type in-situ doped polysilicon layer. Preferably, the thickness of layer 129 is approximately 120 nm (nanometers). As an example, layer 136 can be a 60 nm thick layer of silicon nitride ($Si_3N_4$), and layer 134 can be a 15 nm thick layer of an oxide formed using TEOS (tertraethylorthosilicate). In this example, spacer 142 can be comprised of silicon nitride; spacer 146 can be comprised of polysilicon, and spacer 155 can be comprised of an oxide formed using TEOS.

Furthermore, a region 163 can be formed during the formation of layer 150. In one embodiment, region 163 is a non-crystalline epitaxial region formed during the formation of layer 150 and doped by diffusion of dopant from layer 129. In another embodiment, region 163 is a portion of layer 150, which is doped by diffusion of dopant from layer 129.

An emitter electrode 154 is formed over layers 136 and 150, and adjacent to and over spacers 142, 146, and 155. In one embodiment, the electrode 154 is formed by depositing an in-situ doped polysilicon layer, i.e., an electrically conductive layer. In another embodiment, electrode 154 can be deposited and then doped via ion implantation. In-situ, as used herein, includes either doping using the same chamber or the same tool.

Figure 2:
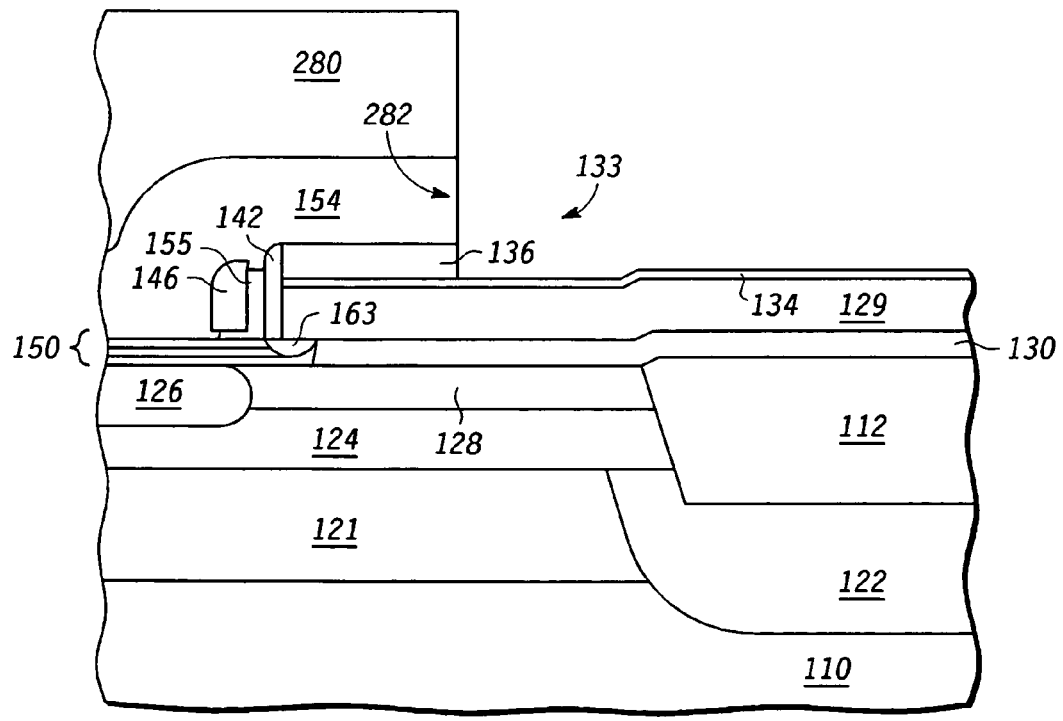
FIG. 2 illustrates a cross-sectional view of the portion of the bipolar transistor of FIG. 1 after a later stage of the manufacturing process according to the first embodiment.

Turning to the next drawing, FIG. 2 illustrates a cross-sectional view of a portion of the bipolar transistor 100 after a later stage of the manufacturing process. A mask layer 280 is formed over a portion of electrode 154. Additionally, portions of electrode 154 and layer 136 have been removed, using layer 280 as an etch mask.

In one embodiment, layer 280 is formed over the portion of electrode 154 located above layer 150, over spacers 142, 146, and 155. As an example, layer 280 can comprise materials such as photoresist, silicon oxide, silicon oxy-nitride, and the like. When layer 280 is not photoresist, it can also be referred to as a hard mask.

The removal of a portion of electrode 154 can be done using various etch techniques. As an example, electrode 154 can be removed in a three step etch process. The first etch removes native oxides and surface contaminants that would hinder achieving a uniform etch. The second etch removes the main portion of electrode 154 and creates desired profile for an anisotropic sidewall 282. The third etch removes the remaining residues and stringers of electrode 154 and stops on layer 136. In the same or a different embodiment, the etch process can be a RIE (reactive ion etch) process.

In one embodiment, layer 136 is also removed using one or more etching processes. As an example, layer 136 can be etched by a carbon fluoride gas ($CF_4$) mixed with $O_2$ and $N_2$. In other embodiments, layer 136 is etched by gas etchants comprised of silicon fluoride ($SiF_4$), nitrogen fluoride ($NF_3$), carbon hydrogen fluoride ($CHF_3$), or carbon fluoride ($C_2F_6$). In the same or a different embodiment, layer 136 can be etched with a RIE process.

A high quality sidewall 282 is preferred for accurate self-aligned ion implantations in a later manufacturing step. By using an anisotropic etch process to etch electrode 154 and layer 136, the preferred profile for sidewall 282 can be formed.

Figure 3:
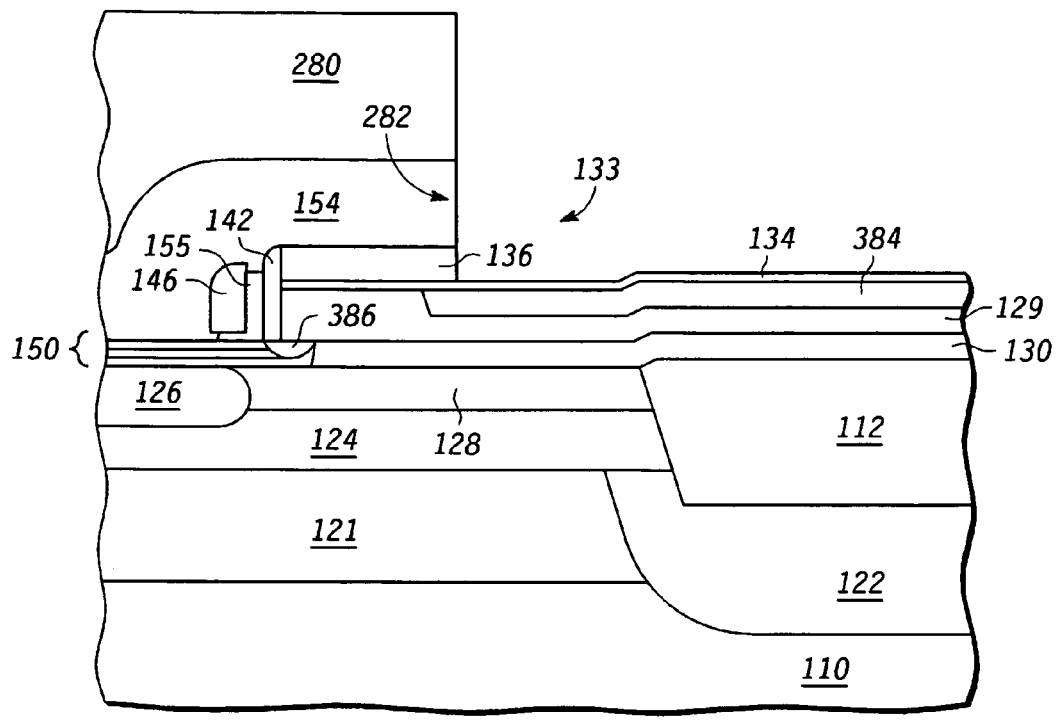
FIG. 3 illustrates a cross-sectional view of the portion of the bipolar transistor of FIG. 2 after a subsequent stage of the manufacturing process according to the first embodiment.

FIG. 3 illustrates a cross-sectional view of a portion of the bipolar transistor 100 after a subsequent stage of the manufacturing process. After etching electrode 154 and layer 136, dopants are implanted into layer 129 to increase the doping concentration within region 384 of layer 129. As an example, region 384 can be formed by one or multiple boron implants into layer 129. In one embodiment, the implantation is self-aligned to sidewall 282. In the same or a different embodiment, dopants can be implanted closer to a region 386 between layers 150 and 129. The implant energy, dose, and angle can be adjusted to such that region 384 is either a shallow, highly doped (i.e., low resistance) region or a deep, highly doped (i.e., low resistance) region with layer 129.

In other embodiments, the implanting of dopants into layer 129 can be performed before the etching of electrode 154 and layer 136 and after the formation of layer 280. In one example, the implanting of dopants into layer 129 can occur before etching electrode 154. In another example, the implantation can occur after etching electrode 154 but before etching electrode 154 and layer 136.

Dopants from this implant will replenish dopants lost from layer 129 during the high temperature manufacturing process occurring after the formation of layer 129, and will increase surface doping of layer 129 to help reduce the interface resistance between layer 129 and subsequently formed metal contacts. The closer the proximity of region 384 to the region 386, the lower the base resistance of a portion of the bipolar transistor 100. Higher energy or dose implants and/or high angle implants can be used to place region 384 under the sidewall 282 to further reduce this proximity. Optionally, the position of sidewall 282 relative to contact region 386 can be reduced to further reduce the base resistance by reducing the critical dimension of layer 280.

Figure 4:
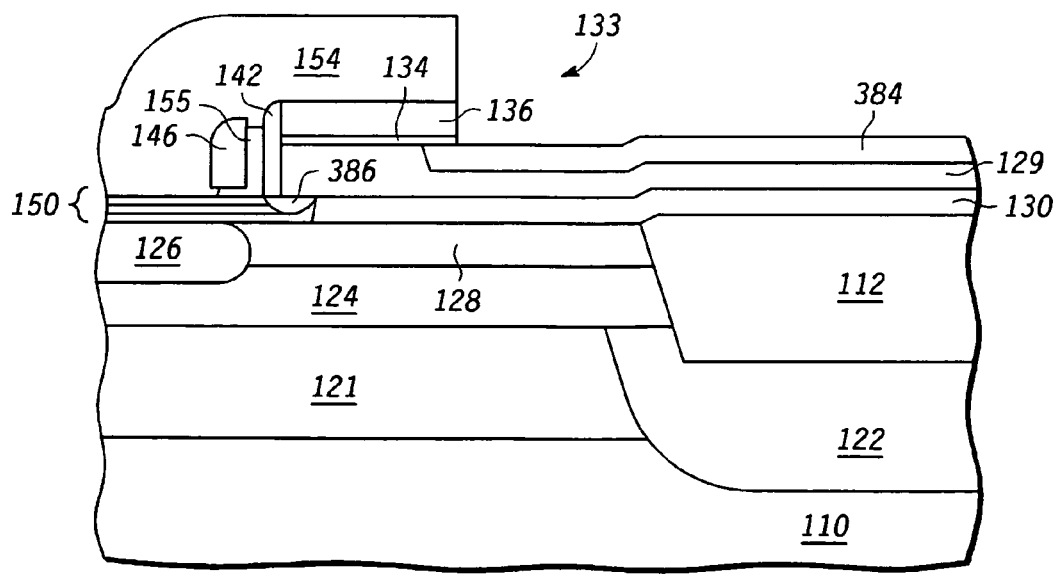
FIG. 4 illustrates a cross-sectional view of the portion of the bipolar transistor of FIG. 3 after a further stage of the manufacturing process according to the first embodiment.

FIG. 4 illustrates a cross-sectional view of a portion of the bipolar transistor 100 after a further stage of the manufacturing process. Layer 280 (FIG. 3) and a portion of layer 134 have been removed.

As an example, layer 280 (FIG. 3) can be removed using conventional photoresist stripping techniques. Layer 134 can be etched using a wet etch process, stopping on layer 129. Use of a mask is usually not required for the etching of layer 134 because of the selective nature of the etch. In another embodiment, a RIE process is used to etch layer 134. In the same or different embodiment, a portion of layer 134 remains located beneath the remaining portion of layer 136 and electrode 154. Additionally, layer 129 can be patterned and anisotropically etched using methods well known in the art, but the process is not shown in FIG. 4.

Figure 5:
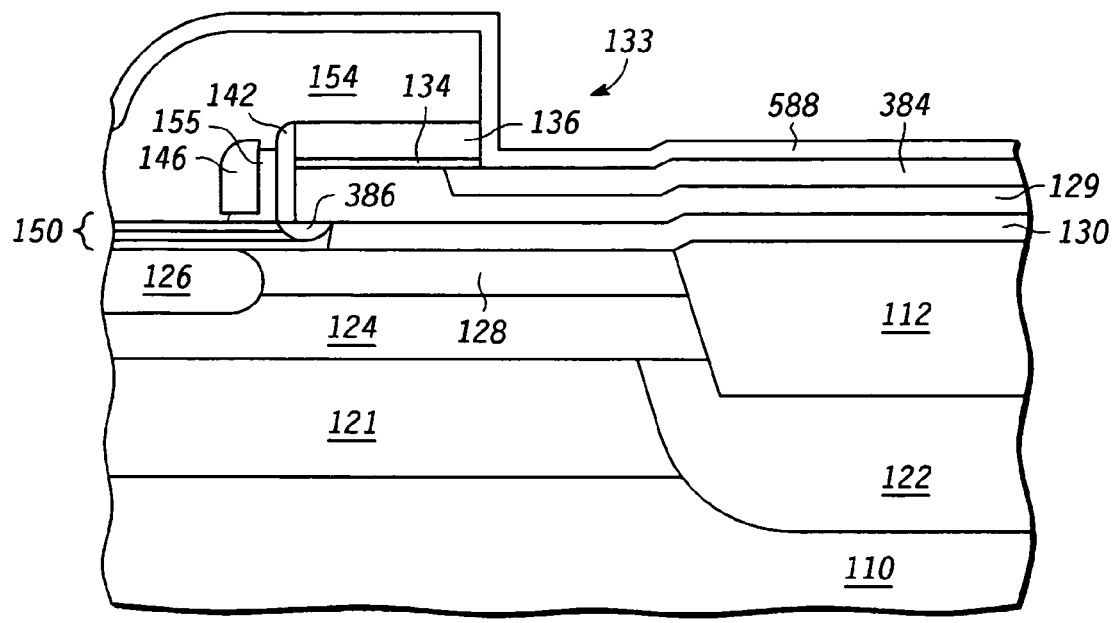
FIG. 5 illustrates a cross-sectional view of the portion of the bipolar transistor of FIG. 4 after a subsequent stage of the manufacturing process according to the first embodiment.

FIG. 5 illustrates a cross-sectional view of a portion of the bipolar transistor 100 after a subsequent stage of the manufacturing process. A cap layer 588 is formed over layers 129, 134, 136, and electrode 154 before annealing the dopants.

Annealing a portion of the dopants will cause diffusion of the dopants implanted into region 384, repair the implant damage in layer 129, and electrically activate the dopant. As an example, a rapid thermal anneal (RTA) process can be used to anneal the dopants. In other embodiment, a furnace anneal process can be used. Furthermore, additional embodiments can use other annealing techniques, such as laser annealing.

Layer 588 prevents surface dopant depletion from region 384 during the annealing process. As an example, layer 588 can be formed by growing and/or depositing an oxide or other dielectric layer over layers 129, 134, 136, and electrode 154. In one embodiment, an approximately 15 nm thick layer of oxide formed using TEOS can be deposited.

Figure 6:
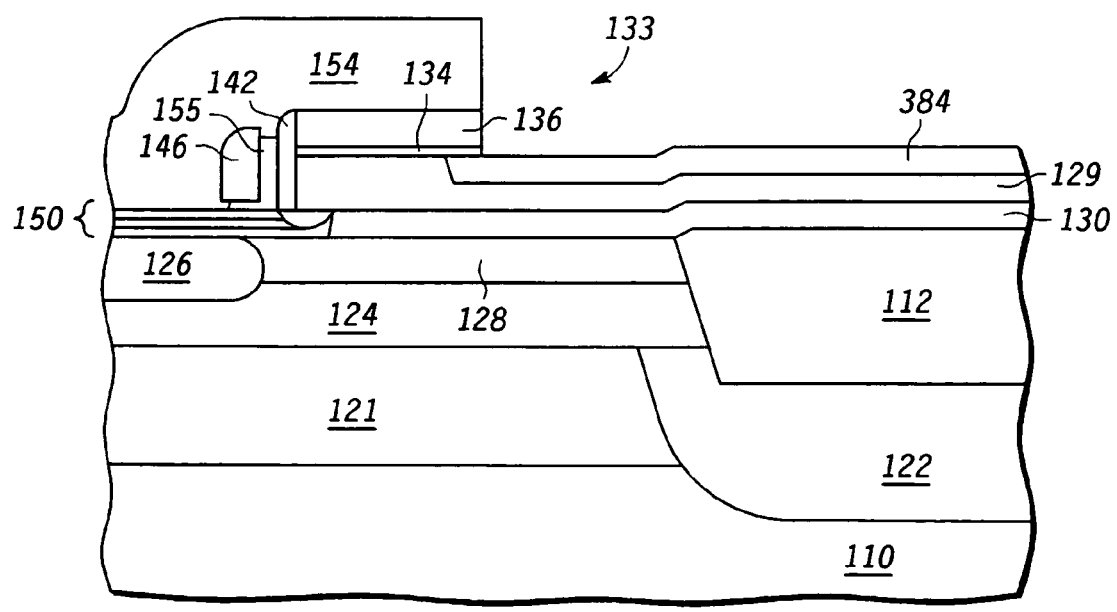
FIG. 6 illustrates a cross-sectional view of a portion of the bipolar transistor of FIG. 5 after a later stage of the manufacturing process according to the first embodiment.

FIG. 6 illustrates a cross-sectional view of a portion of the bipolar transistor 100 after a later stage of the manufacturing process. The a portion of the bipolar transistor 100 has been annealed, and layer 588 (FIG. 5) has been removed.

Layer 588 (FIG. 5) can be removed using a wet etch process. In another embodiment, a RIE process is used to remove layer 588 (FIG. 5). Furthermore, after forming additional portions of the base emitter electrodes (e.g., silicide portions) and one or more subsequent metallization and passivation layers (not shown in FIG. 6), substrate 110 can be diced or cut into die or chips to singulate a portion of the bipolar transistor 100.

Figure 7:
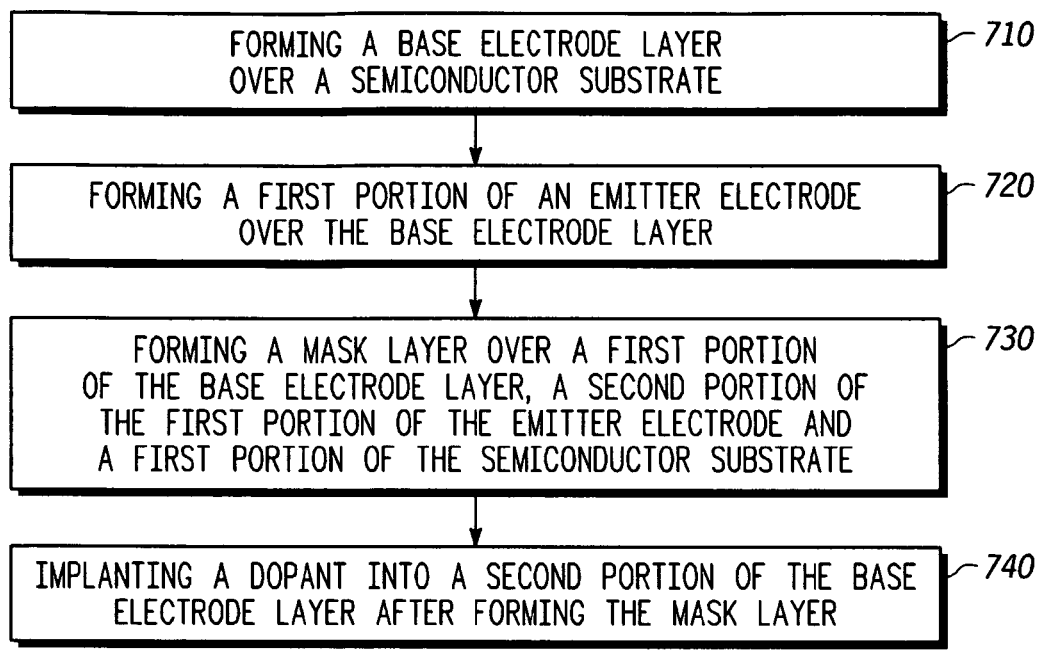
FIG. 7 illustrates a flow chart for a method of manufacturing a portion of a bipolar transistor according to an embodiment.

FIG. 7 illustrates a flow chart 700 for a method of manufacturing a bipolar transistor. This method forms a doped base-emitter structure for a bipolar transistor. Flow chart 700 includes a step 710 of forming a base electrode layer over a semiconductor substrate. As an example, the base electrode layer and semiconductor substrate of step 710 can be similar to layer 129 and substrate 110 in FIG. 1, respectively.

Flow chart 700 in FIG. 7 continues with a step 720 of forming a first portion of an emitter electrode over the base electrode layer. As an example, the emitter electrode of step 720 can be similar to electrode 154 of FIG. 1. Flow chart 700 in FIG. 7 continues with a step 730 of forming a mask layer over a first portion of the base electrode layer, a second portion of the first portion of the emitter electrode and a first portion of the semiconductor substrate. As an example, the mask layer of step 730 can be similar to layer 280 of FIG. 2.

Subsequently, flow chart 700 in FIG. 7 continues with a step 740 of implanting a dopant into a second portion of the base electrode layer after forming the mask layer. As an example, the second portion of the base electrode layer of step 740 can be similar to region 384 of FIG. 3.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that layers 129, 130, 134, 136, 280, or 588 may comprise many different materials and may be formed by many different methods, and that the foregoing discussion of certain of these embodiments does not necessarily represent a complete description of all possible embodiments. In an another example, a portion of the bipolar transistor 100 can be a PNP transistor.

As further example, an implant screen layer can be used during the implementation described with respect to FIG. 3. Layer 136 (FIGS. 1 and 2) can be used as the implant screen, or a different layer can be formed over layer 129 after removal of layer 136. The implant screen layer can be used to adjust the implanted doping profiled in region 384 (FIG. 3).

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims. Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of manufacturing a bipolar transistor comprising:
   forming a base electrode layer over a semiconductor substrate;
   forming a first portion of an emitter electrode over the base electrode layer;
   forming a mask layer over a first portion of the base electrode layer, a second portion of the first portion of the emitter electrode and a first portion of the semiconductor substrate; and
   implanting a dopant into a second portion of the base electrode layer after forming the mask layer.

2. The method of claim 1, further comprising:
   using the mask layer as an etch mask to pattern an electrically conductive layer, wherein:
   forming the first portion of the emitter electrode comprises:
      depositing the electrically conductive layer; and
   implanting the dopant comprises:
      using the mask layer as an implant mask for the dopant.

3. The method of claim 2, wherein:
   implanting the dopant is performed after using the mask layer to pattern the electrically conductive layer.

4. The method of claim 1, further comprising:
   forming one or more dielectric layers over the base electrode layer before forming the first portion of the emitter electrode;
   using the mask layer as an etch mask to pattern an electrically conductive layer;
   using the mask layer as an etch mask to pattern the one or more dielectric layers, and wherein:
   forming the first portion of the emitter electrode comprises:
      depositing the electrically conductive layer; and
   implanting the dopant comprises:
      using the mask layer as an implant mask for the dopant.

5. The method of claim 1, further comprising:
   forming one or more dielectric layers over the base electrode layer before forming the first portion of the emitter electrode;
   using the mask layer as an etch mask to pattern an electrically conductive layer;
   using the mask layer as an etch mask to pattern the one or more dielectric layers, and wherein:
   implanting the dopant is performed before using the mask layer to pattern the one or more dielectric layers;
   forming the first portion of the emitter electrode comprises:
      depositing the electrically conductive layer; and
   implanting the dopant comprises:
      using the mask layer as an implant mask for the dopant.

6. The method of claim 1, further comprising:
forming one or more dielectric layers over the base electrode layer before forming the first portion of the emitter electrode comprises:
    using the mask layer as an etch mask to pattern an electrically conductive layer;
    using the mask layer as an etch mask to pattern the one or more dielectric layers, and wherein:
    implanting the dopant is performed after using the mask layer to pattern the one or more dielectric layers;
    forming the first portion of the emitter electrode comprises:
        depositing the electrically conductive layer; and
    implanting the dopant comprises:
        using the mask layer as an implant mask for the dopant.

7. The method of claim 1, wherein:
implanting the dopant further comprises:
    self-aligning the dopant to the emitter electrode.

8. The method of claim 1, further comprising:
annealing the dopant after implanting the dopant.

9. The method of claim 8, further comprising:
removing the mask layer before annealing the dopant.

10. The method of claim 8, further comprising:
forming a third portion of the base electrode after annealing the dopants; and
forming a third portion of the emitter electrode after annealing the dopant.

11. The method of claim 8, further comprising:
forming a cap layer over the first portion of the emitter electrode and the first and second portions of the base electrode layer prior to annealing the dopant.

12. The method of claim 11, further comprising:
forming a fourth portion of the base electrode after annealing the dopant;
forming a fourth portion of the emitter electrode after annealing the dopant; and
removing the cap layer before forming the fourth portion of the base electrode layer and before forming the fourth portion of the emitter electrode.

13. The method of claim 1, wherein the dopant comprises boron.

14. A method of manufacturing a bipolar transistor comprising:
    forming a base electrode layer over a semiconductor substrate;
    forming one or more dielectric layers over the base electrode layer;
    forming an electrically conductive layer over a first portion of the base electrode layer;
    forming an etch mask layer over the electrically conductive layer;
    using the etch mask layer to pattern the electrically conductive layer to form a first portion of an emitter electrode;
    using the etch mask layer to pattern the one or more dielectric layers; and
    self-aligning an implant of a dopant into a second portion of the base electrode layer using the etch mask layer as an implant mask for the dopant, wherein:
    the first and second portions of the base electrode layer are adjacent to each other.

15. The method of claim 14, wherein:
forming the base electrode layer further comprises:
    doping the base electrode layer before forming the first portion of the emitter electrode.

16. The method of claim 14, wherein
forming the base electrode layer comprises:
    doping a base electrode layer in-situ.

17. The method of claim 14, further comprising:
annealing the dopant after the self-aligning of the implant.

18. The method of claim 17, further comprising:
removing the etch mask layer after self-aligning the implant and before annealing the dopant.

19. The method of claim 17, further comprising:
capping the first portion of the emitter electrode and the first and second portions of the base electrode layer with a dielectric layer prior to annealing the dopant.

20. A bipolar transistor manufactured by the method of claim 1.

* * * * *